(12) United States Patent
Mine et al.

(10) Patent No.: US 9,552,906 B1
(45) Date of Patent: Jan. 24, 2017

(54) CURRENT LEAD FOR CRYOGENIC APPARATUS

(71) Applicant: GENERAL ELECTRIC COMPANY, Schenectady, NY (US)

(72) Inventors: Susumu Mine, Niskayuna, NY (US); Evangelos Trifon Laskaris, Schenectady, NY (US); Minfeng Xu, Ballston Lake, NY (US); Ye Bai, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/841,746

(22) Filed: Sep. 1, 2015

(51) Int. Cl.
| | | |
|---|---|---|
| *H01B 12/04* | (2006.01) | |
| *H01B 12/16* | (2006.01) | |
| *G01R 15/20* | (2006.01) | |
| *G05B 11/01* | (2006.01) | |

(52) U.S. Cl.
CPC ............ *H01B 12/04* (2013.01); *G01R 15/202* (2013.01); *G05B 11/01* (2013.01); *H01B 12/16* (2013.01)

(58) Field of Classification Search
CPC ....... G01R 15/202; G05B 11/01; H01B 12/16; H01B 12/04
See application file for complete search history.

(56) References Cited

U.S. PATENT DOCUMENTS

| | | | | |
|---|---|---|---|---|
| 5,396,206 A | * | 3/1995 | Herd | ................... H01F 6/065 174/125.1 |
| 5,426,094 A | * | 6/1995 | Hull | .................. H01F 6/065 174/125.1 |
| 5,432,297 A | * | 7/1995 | Dederer | ................ H01R 4/68 174/125.1 |
| 5,742,217 A | | 4/1998 | Bent et al. | |
| 5,831,278 A | | 11/1998 | Berkowitz | |
| 5,880,068 A | * | 3/1999 | Gamble | ................. H01F 6/065 174/125.1 |
| 5,991,647 A | | 11/1999 | Brockenborough et al. | |
| 6,034,324 A | | 3/2000 | Dixon et al. | |
| 6,034,588 A | | 3/2000 | Ando et al. | |
| 6,069,395 A | | 5/2000 | Yamaguchi et al. | |
| 6,112,531 A | | 9/2000 | Yamaguchi | |
| 6,359,540 B1 | * | 3/2002 | Spiller | .................... H01R 4/68 335/216 |
| 6,389,685 B1 | | 5/2002 | Iwasa | |

(Continued)

OTHER PUBLICATIONS

Lee et al., "Development of vapor-cooled HTS-copper 6-kA current lead incorporating operation in the current-sharing mode", Cryogenics, vol. 44, Issue: 1, pp. 7-14, Jan. 2004.

(Continued)

*Primary Examiner* — Colleen Dunn
(74) *Attorney, Agent, or Firm* — Melissa K. Dobson

(57) ABSTRACT

In embodiments of the invention, a superconductor lead is configured to have less ohmic heating by its own current and less heat conduction from room temperature to cryogenic temperature, where a cryogenic apparatus is located. The superconducting lead with no ohmic resistance and low thermal conductivity disclosed herein maximizes current capacity by placing superconductors in parallel, each having equal current. Thus, the resistances are controlled to provide uniform current distribution through each superconductor of the high temperature superconducting (HTS) lead.

19 Claims, 8 Drawing Sheets

(56) References Cited

U.S. PATENT DOCUMENTS

| | | |
|---|---|---|
| 6,577,028 B2 | 6/2003 | Laskaris et al. |
| 6,597,082 B1 | 7/2003 | Howard et al. |
| 6,600,398 B2 | 7/2003 | Roth et al. |
| 6,684,486 B1 | 2/2004 | Willen |
| 6,753,748 B1 | 6/2004 | Schlenga |
| 6,759,593 B2 | 7/2004 | Spreafico |
| 6,925,316 B2 | 8/2005 | Rey |
| 7,517,834 B2 | 4/2009 | Wong et al. |
| 7,632,784 B2 | 12/2009 | Rokhvarger et al. |
| 7,649,720 B2 | 1/2010 | Markiewicz |
| 7,928,321 B2 | 4/2011 | Corsaro et al. |
| 8,044,752 B2 | 10/2011 | Otto et al. |
| 8,283,293 B2 | 10/2012 | Schlenga et al. |
| 8,420,558 B2 | 4/2013 | Tenbrink et al. |
| 8,437,819 B2 | 5/2013 | Takayasu et al. |
| 8,442,605 B2 | 5/2013 | Willen et al. |
| 8,623,787 B2 | 1/2014 | Willen et al. |
| 8,629,087 B2 | 1/2014 | Usoskin et al. |
| 8,650,888 B2 | 2/2014 | Steinmeyer et al. |
| 8,838,193 B2 | 9/2014 | Maher et al. |
| 8,855,731 B2 | 10/2014 | Tanaka et al. |
| 8,886,267 B2 | 11/2014 | Folts et al. |
| 8,965,468 B2 | 2/2015 | Iwasa |
| 9,000,295 B1 | 4/2015 | Graber et al. |
| 9,014,769 B2 | 4/2015 | Harrison |
| 9,082,535 B2 | 7/2015 | Blakes et al. |
| 9,093,200 B2 | 7/2015 | Van Der Laan |
| 2014/0302997 A1 | 10/2014 | Takayasu |

OTHER PUBLICATIONS

K Nemoto et al., "Development of a low heat leak current-lead system", IEEE Transactions on Applied Superconductivity, vol. 14, Issue: 2, pp. 1222-1224, Jun. 2004.

Kim et al., "Current Sharing and Redistribution in Superconducting DC Cable", IEEE Transactions on Applied Superconductivity, vol. 23, Issue: 3, Jun. 2013.

* cited by examiner

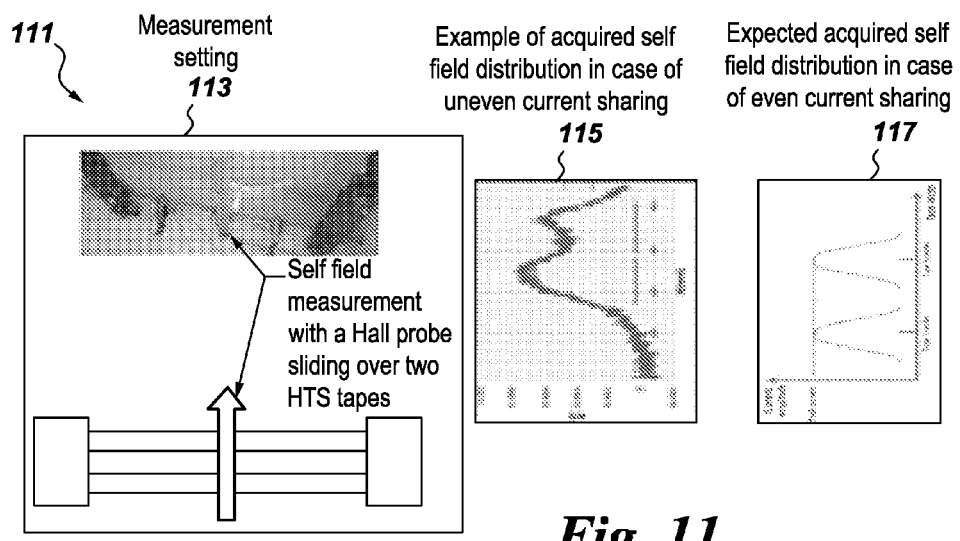
Fig. 11
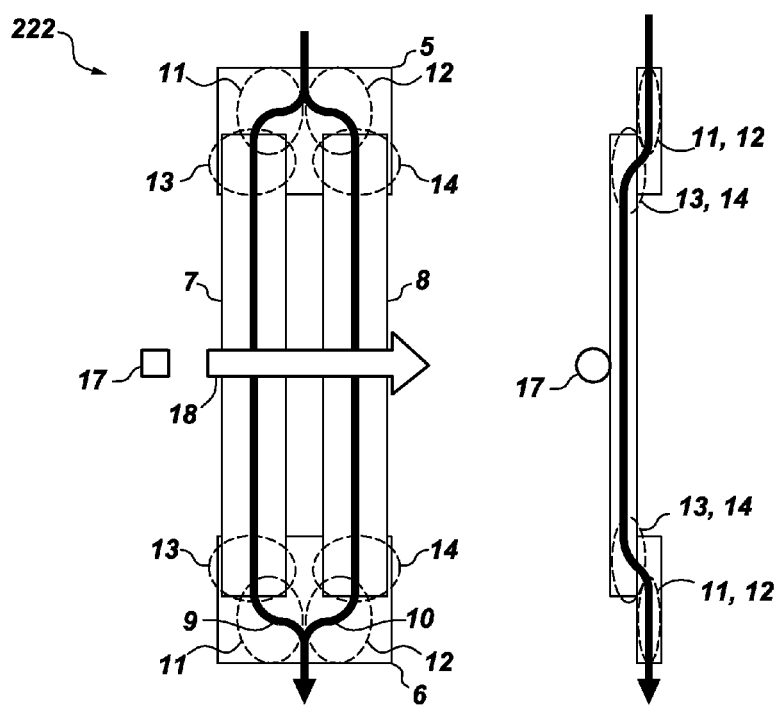
Fig. 12   a   b

CURRENT LEAD FOR CRYOGENIC APPARATUS

FIELD

The subject matter disclosed herein relates to generally to the field of superconductors, and more specifically, to high temperature superconducting (HTS) leads used to carry a broad range of currents from power supply sources at non-superconducting or room temperatures to superconductor material of a cryogenic apparatus at low or cryogenic temperatures.

BACKGROUND

Very low temperatures are required to enable superconducting material to exhibit its properties. Power must be supplied to these superconducting devices operating at cryogenic temperatures, the power sources often at room temperature, or about 300 K. In order to drop the temperature of the power conductors or connections to the operating range of the low-temperature superconductor material (which is typically about 4K) and then maintain that temperature, supercooled gas is often used. This is because the large currents that the conductors carry generate heat due to their resistive properties. Superconductor leads must eliminate the heat generated by these large currents with thermal insulators, but instabilities and heat leaks from the material can still occur.

Since the current capacity of superconductors decreases with increasing temperature, the current capacity of the material is not enough at the high temperature end of the lead. The invention disclosed herein attempts to solve the situation, and increase current capacity, while delivering even current distribution and maximizing lead current capacity.

Uniform current distribution has been demonstrated as an important requirement in superconducting DC cables. The contact resistances where individual superconducting tapes are soldered to the copper terminals on each end create some variations as they are made or can be due to differential aging of the solder material. The variations are potential causes for non-uniform current distribution among the tapes in the cable, which adversely affects many operational parameters, such as increased AC loss, lower safety margins, and potential damage to the cable. This is the same issue as described above where the current capacity of the material is not enough at the high temperature end of the lead. Furthermore, the non-uniform current distribution is caused by the variation of contact resistance and no technical solutions have been proposed to solve this issue.

A need exists to increase current capacity of superconductors at the high temperature end of the lead. Advantageously, the configuration of superconductors will provide this increased current capacity, and maximize the total lead current capacity. Further, these developments will enable those skilled in the art to extend this methodology from magnetic resonance applications to overall HTS power cables.

SUMMARY

The above and other drawbacks or deficiencies may be overcome or alleviated by development of a system as described as follows. Cryogenic apparati such as superconducting magnets, motors, generators, fault current limiters and or superconducting transformers utilize current leads, which feed electric current from power supply at room temperature to cryogenic apparatus at low temperature.

The lead beneficially is designed to have lower ohmic heating by its own current and lower heat conduction from room temperature to cryogenic temperature, where a cryogenic apparatus is located. The superconductor, which has no ohmic resistance and low thermal conductivity, is developed to have an appropriate material for the current lead. Currently, such superconductor is available only around or below 100 K. Embodiments of the application thus focus on the lower temperature of the current lead. Such materials utilized include recognized HTS wire: BSCCO ("Bismuth-Strontium-Calcium-Copper-Oxygen."), known as first generation (1G) wire, REBCO ("Rare earth-Barium-Copper Oxide") for the superconducting compound, or $MgB_2$ ("Magnesium Diboride").

Since the current capacity of the superconductors decrease with increasing temperature, the current capacity of the material is not enough at the high temperature end of the lead.

To solve the situation, multiple superconductors can be used in parallel for increasing current capacity. To maximize the current capacity, each superconductor in the parallel configuration has equal current, or approximately equivalent current. Otherwise, one superconductor reaches its critical current first and makes it resistive. In some cases, this resistive superconductor can generate enough heat to lower the current capability of the neighbor superconductor and make it resistive as well, and so on. This effect can create a domino effect that eventually causes the entire superconductor leads assembly to be resistive. When that happens, the leads can be burned or damaged. Embodiments disclosed herein provide for ways to make even current for each superconductor and maximize the total lead current capacity.

The current distribution over parallel conductors is controlled by the resistances from an end terminal to each conductor. Since superconductors have no resistance by nature, the resistances are from the copper terminal and contact resistance between the copper terminal and the superconductor. To make even current distribution, such resistances are evenly controlled by taking one or more measures.

Embodiments disclosed include: (1) Copper terminal slits to make each resistance from copper to superconductor about the same; (2) Indium compressed joint to control compressive force to make even contact resistance; (3) Soldered brass, or stainless steel, or other resistive materials in which the resistance makes even resistance (i.e., ignores small but scattered soldering resistance); (4) Measuring current distribution by Hall probe and then adjusting the joint resistance.

In one embodiment, a high temperature superconducting (HTS) lead for use in transmitting current from room temperature to cryogenic temperatures is utilized comprising: two or more superconductors positioned in parallel, each superconductor having a first end and a second end; at least two electrical connectors, one connected at said first end and one connected at said second end; wherein each said superconductor has a current distribution controlled by resistance between the electrical connector and each of said first end and said second end of the superconductor, each of the superconductors transmitting equivalent current. In one aspect, a combination of the current distribution through the superconductors has a total lead current capacity that is maximized by the equivalent current distributed through each superconductor. Typically, the first end is a warm end and said second end is a cold end. At least one of the two electrical connectors is a copper terminal, but both may be copper, brass, or any suitable material or combination.

One embodiment uses a copper terminal that takes the shape of a fork with a slit between at least two prongs, thus a multi-pronged fork. In another embodiment, the copper terminal is compressed to the two or more superconductors at the first end or the second end with a resistive element sandwiched therebetween. The resistive element is Indium, or comparable materials. In another embodiment, the copper terminal is soldered to the two or more superconductors with a resistive element sandwiched therebetween. The resistive element is stainless steel, brass, other alloy materials, or combinations thereof. Further embodiments may therefore include any of the above terminals utilized individually or in combination. Thus, the two electrical conductors may comprise one or more of a multi-prong copper conductor, at least one electrical conductor compressed to the two or more superconductors at said warm end or said cold end with a resistive element sandwiched therebetween, and at least one electrical conductor soldered to the two or more superconductors at said warm end or said cold end with a resistive element sandwiched therebetween, alone or in combination.

A method of distributing current uniformly through two or more superconductors comprises the steps of: providing the HTS lead of claim 1; and transmitting current from a power supply at room temperature through said superconductors to a cryogenic apparatus at cryogenic temperature, such that current distribution is uniform throughout the HTS lead. The method further comprises a step of controlling resistance at the electrical connectors to provide equivalent current through each superconductor.

In addition, a method of measuring current in each of the two or more superconductors of the high temperature superconducting (HTS) lead is disclosed, the method comprising the steps of: providing a magnetic measurement probe at the superconductors to scan a magnetic field; and acquiring magnetic field measurements generated by the current in each of the superconductors before the current reaches respective critical currents of each of the superconductors. The magnetic measurement probe is a Hall probe or the like that moves in a direction to scan the magnetic field. The magnetic measurement probe slides over the superconductors and measures current distribution by sensing the magnetic field generated by the current in each of the superconductors. Where the method further comprises a step of acquiring a field distribution where uneven current sharing is present, a step of adjusting resistance at the electrical connectors using the magnetic field measurements is implemented. During the step of adjusting resistance, the field distribution allows and provides even current sharing between each superconductor.

BRIEF DESCRIPTION OF THE DRAWINGS

FIG. 11 demonstrates a process in one embodiment for measuring uneven current distribution over parallel superconductors, and controlling the joint resistance to create even current distribution.

FIG. 12 depicts an embodiment of the system utilizing a magnetic field sensor to measure uneven current distribution over parallel superconductors, and then creating the same or similar joint resistance by adjusting brass or other resistive material plate thickness.

DETAILED DESCRIPTION

Figure 1A:
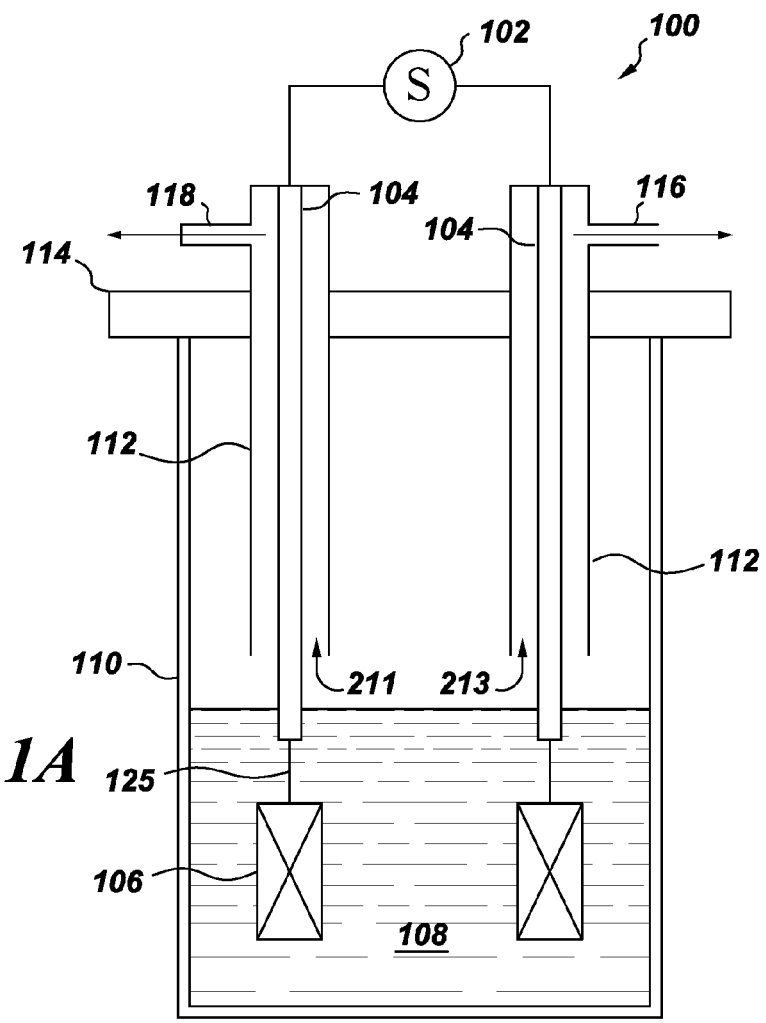
FIG. 1A depicts an apparatus defined as a cryogenic system.

Various embodiments will be described more fully hereinafter with reference to the accompanying drawings. Such embodiments should not be construed as limiting. For example, one or more aspects can be utilized in other embodiments and even other types of systems and methodologies. Referring to the drawings in general, it will be understood that the illustrations are for the purpose of describing particular embodiments and are not intended to be limiting.

FIG. 1A illustrates a cryogenic system 100 having a power supply 102 at room temperature. Cryogen gas-cooled current leads 104 connect the power supply 102 to the cryogenic apparatus 106. Sleeves 112 house the current leads 104 which extend from the power supply through a lid 114 of the cryogenic system to the superconductor. The sleeves provide cooling gas paths around the leads 104 from open ends 211, 213 through to gas outlets 116, 118, respectively. The arrows (→) designate the flow of cryogen gas through the sleeves 112 of the system 100. The cryogenic apparatus 106 here includes a superconducting magnet, but also includes various superconducting equipment at low temperatures, including motors, generators, fault current limiters and or superconducting transformers. Here, the cryogenic apparatus 106 is in a bath of cryogen 108 (e.g. helium or nitrogen, etc.) housed within the cryostat 110 to keep the cryogenic system cold. For the cryogenic system 100 illustrated, the superconducting equipment is utilized at temperatures below ~100 K. The leads 104 may be solid structures, flattened tapes, or hollow structures. The lead has an upper (warmer) portion 25 (See FIG. 1B) that operates at about 40-65 K, with typical operation around 50 K during ramping (e.g. charging) of the magnet 106; the lower portion 26 operates at about 4 K and is connected to the magnet lead 125 near the cryogen 108, as the gas exchanges heat with the leads and exits the outlets 116, 118. Hollowed copper leads have allowed cryogen vapor to go through the leads to increase the surface area contact with the vapor.

Figure 1B:
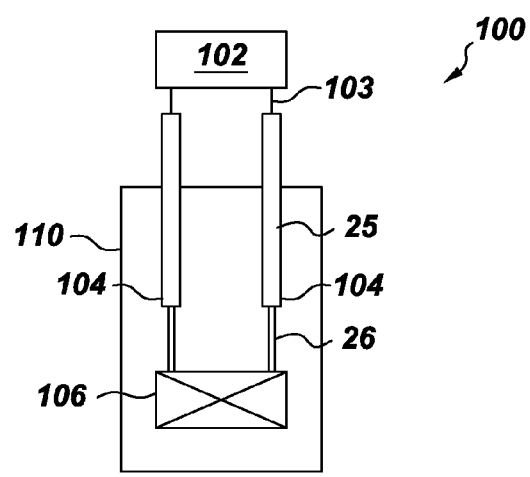
FIG. 1B illustrates a simplified representation of the system of FIG. 1A.

As depicted in FIG. 1B, the cryogenic system 100 is simplified to illustrate current leads 104 having an upper portion 25 and a lower portion 26. The upper lead is connected to the power supply 102 by way of a power cable 103. The current leads 104 feed electric current from power supply 102 at room temperature through the upper portion 25, lower portion 26, and to the cryogenic apparatus 106 at low temperatures. Here, the lower portion 26 is the superconductor, an HTS lead of the disclosed application. As such, the cryogenic apparatus 106 is in a vacuum sealed cryostat 110 without cryogen. Since there is no liquid helium in the cryostat, no vapor is present to cool the lead. Thus, the HTS lead is utilized, which is a superconductor at about 65 K, to reduce the heat load from upper current leads.

Since the cryogenic apparatus is kept cold to perform its function, heat input to the cryogenic area (bottom shaded area in the container at FIG. 1A) should be minimized. The current lead 104 is selected to have:

1) Less Ohmic heating by its own current ($R \times I^2$); and/or
2) Less heat conduction from room temperature (i.e., upper portion at FIG. 1B near power supply) to cryogenic temperature (i.e., lower portion 26 at FIG. 1B), where the cryogenic superconducting equipment are located.

Copper is a material which has been used for the current lead. The current through copper, however, generates ohmic heat. Also, copper has high thermal conductivity that transfers heat from room temperature to cryogenic temperature. The superconductor, with no ohmic resistance (i.e., no heat generation by $R \times I^2$), as well as having low thermal conductivity (i.e., less heat transfer from top to bottom), is thus selected as the material for the current lead 104. In one aspect, the upper portion 25 (See FIG. 1B) can be copper or brass, while the bottom portion 26 is the superconductor.

Since such superconductor is available at temperatures below about 100 K (See FIG. 2), the lower portion 26 of the current lead 104 provides for implementation as demonstrated. The disclosure thereby focuses on the lower temperature, lower portion 26 of the current lead 104. Copper is utilized for the upper portion 25 of the current lead 104 between room temperature and around about 100 K. The superconducting materials utilized include BSCCO, REBCO, and/or $MgB_2$, which show superconductivity below the temperatures of about 110 K, 90 K, and 40 K, respectively. These are referred to here as HTS leads.

Figure 2:
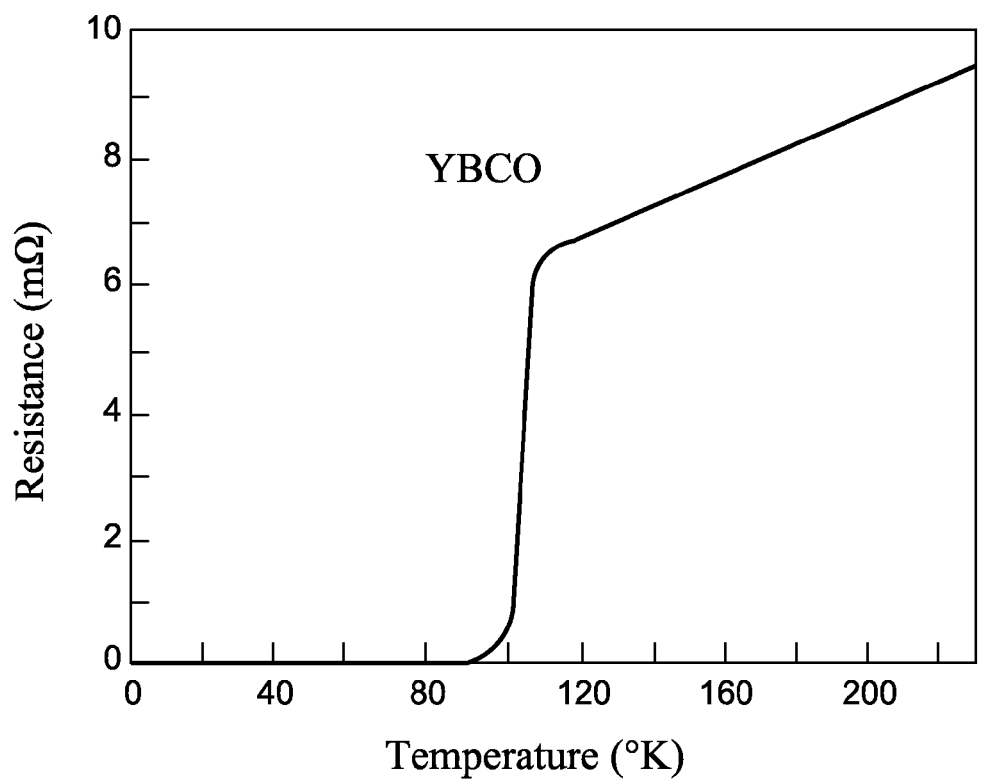
FIG. 2 shows the resistivity change as a function of temperature of an exemplary HTS material.

FIG. 2 depicts a type of REBCO, referred to as a YBCO, ("Yttrium Barium Copper Oxide"), utilized for high temperature superconductivity. Since the current capacity of these HTS materials is usually a few hundred amperes (~100 A), it is not enough to be used as a current lead. The current leads utilized in the present application utilize current capacity greater than about 500 A.

Figure 3:
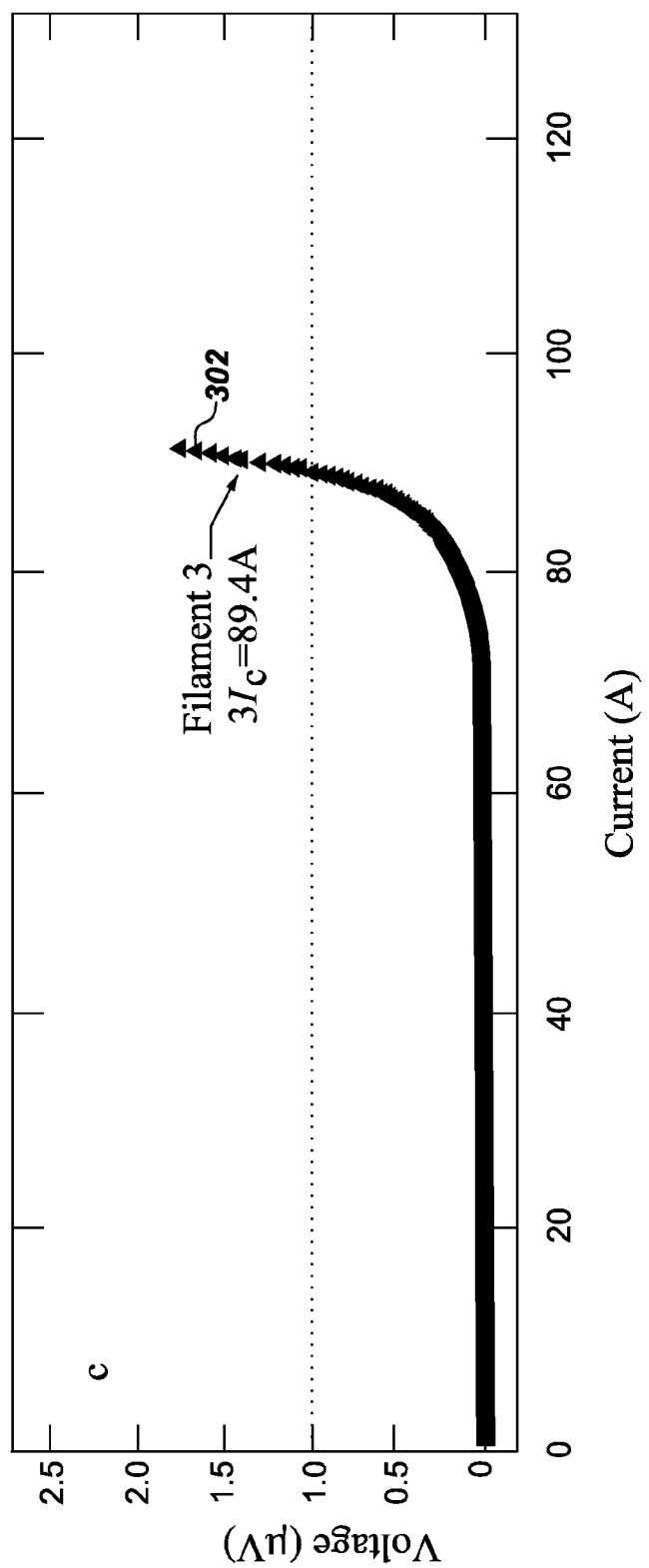
FIG. 3 provides a graphical depiction of superconductor current capacity.

As shown in FIG. 3, curve 302 shows one YBCO tape's current capacity of ~100 A. Below about 100 A, the YBCO tape did not show voltage, which indicates superconducting attributes. The current, under which the superconductor is in the superconducting state, is called critical current (Ic). Here, the superconductor's current capacity is limited at its Ic and not large enough to be used as current lead. Thus, multiple superconductors are used in parallel for increasing current capacity. See FIG. 4.

Figure 4:
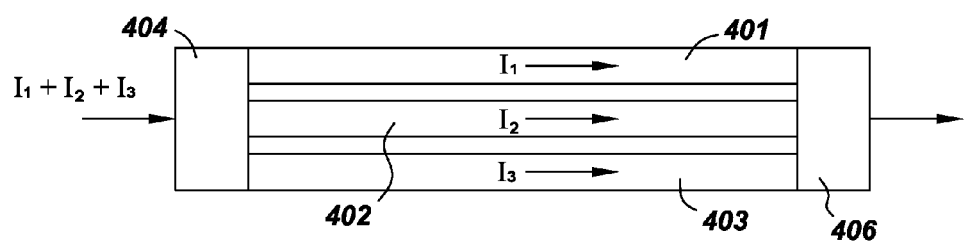
FIG. 4 demonstrates that total current is shared over three superconductors in one embodiment.

FIG. 4 illustrates the total current of $I_1+I_2+I_3$ distributed over three (3) superconductors 401, 402, 403, respectively. The current distribution over the parallel superconductors is controlled by the resistances from each end terminal (404, 406) to each superconductor 401/402/403. Since superconductors themselves have no resistance by their nature, the resistances are from the copper terminals 404, 406 themselves, and the contact resistance between the copper terminal and the superconductors.

Figure 5:
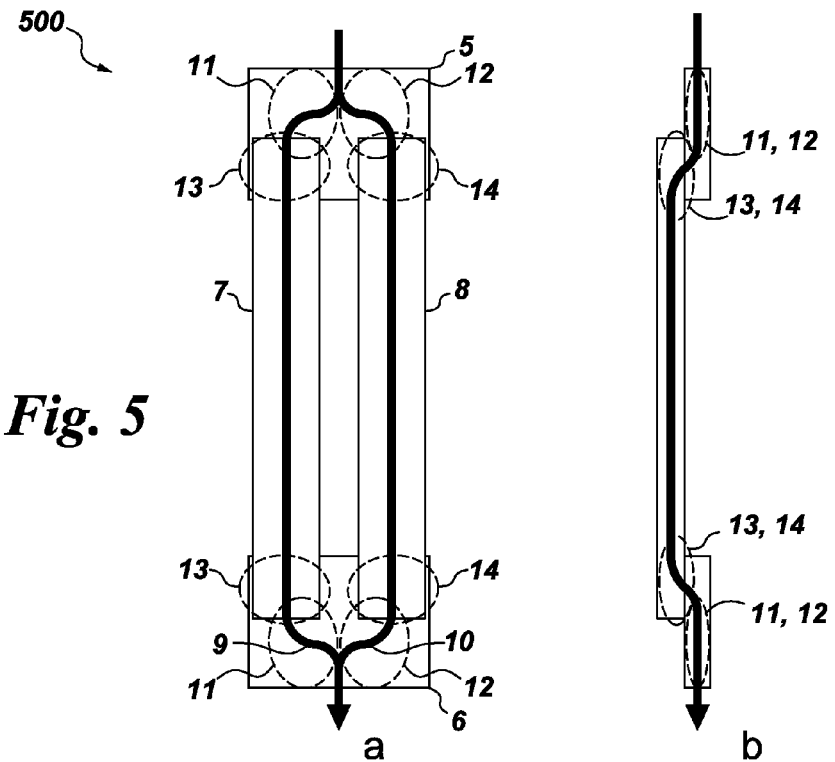
FIG. 5 is an embodiment of a superconducting lead in a front view (a) and side view (b).
Figure 6:
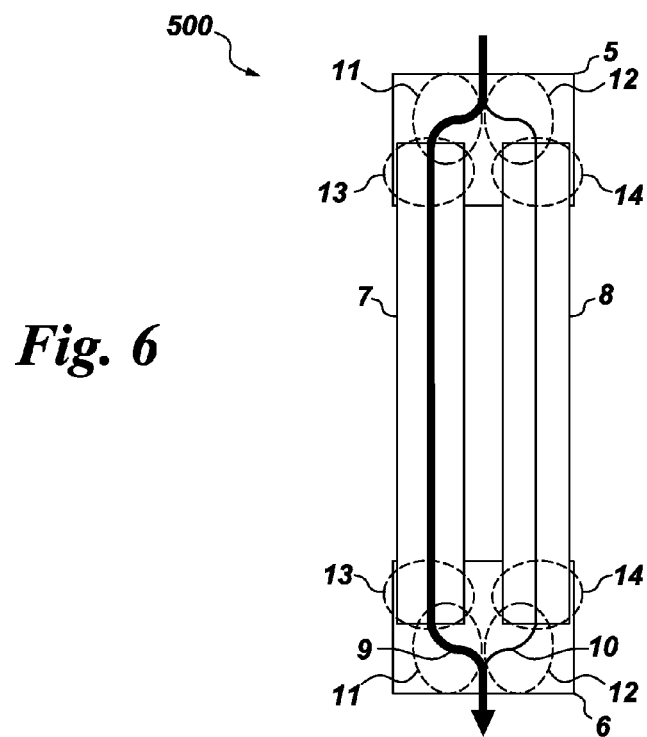
FIG. 6 is an embodiment depicting uneven current distribution in one aspect.

FIG. 5 is a depiction of a cryogenic system 500 as illustrated by a front view (a) and a side view (b). At an upper portion, the copper terminal 5 as described in FIG. 4 is connected to the superconductors 7, 8. At a lower portion, the copper terminals 6 are connected to the superconductors 7, 8. Copper terminal resistance 11, 12 is depicted in side view (b) for current paths 9 and 10, respectively. The contact resistance 13, 14 between the copper terminal and the superconductor is depicted such that contact resistance 13 corresponds with current path 9 and contact resistance 14 corresponds with current path 10. Previously, such resistance was not intentionally controlled. Consequently, as shown by current distribution in FIG. 6, the current throughout the cryogenic system 500 was not evenly shared by parallel conductors where $I_1>I_2>I_3$ (See FIG. 4) such as that shown by the density of the current arrows depicted in FIG. 6. In the cryogenic system 500, one of three conductors reaches its critical current (Ic) first and gets unstable, easily changing to resistive. Thus, the total current was not three times of Ic ($I_1+I_2+I_3<3\times Ic$). FIG. 6 demonstrates the superconducting current lead's uneven current distribution over two superconductors where resistances 11 plus 13 are smaller than resistances 12 plus 14.

It has been realized that providing even, uniform current distribution over parallel connected conductors maximizes the total current.

$$I_1=I_2=I_3$$

By controlling resistances at terminal connections, even current is realized. Since the current capacity of superconductors decreases with increasing temperature, the material's current capacity is not enough at the lead's high temperature end. To solve the situation, multiple superconductors are used in parallel for increasing current capacity. To maximize the current capacity, each superconductor in parallel has similar, preferably equal current. Otherwise, one superconductor reaches its critical current first and makes it resistive. This change of states from superconducting to normal resistive states can generate heat, which could damage the lead. The disclosure as follows provides for uniform current distribution for each superconductor and maximizes the total lead current capacity.

The current distribution over parallel conductors is controlled by the resistances from end terminal to each conductor. Since superconductors themselves have no resistance by their nature, the resistances are from the copper terminal itself and the contact resistance between the copper terminal and the superconductor. To make even current distribution, such resistances are evenly controlled by taking one or more measures described below.

(1) Multi-Prong Copper Terminal

Figure 7:
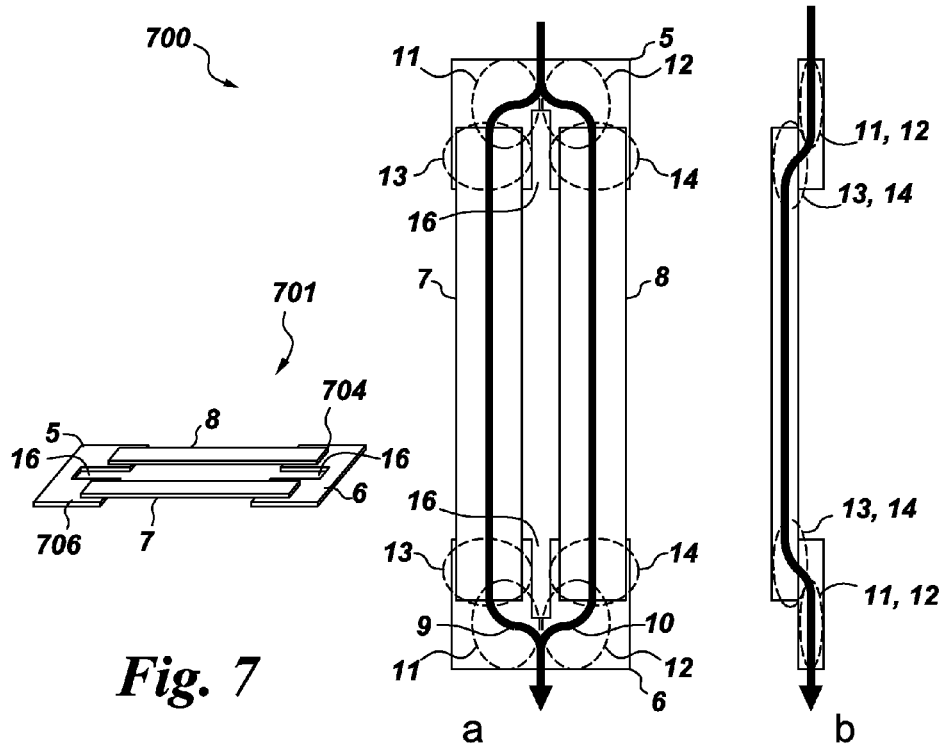
FIG. 7 illustrates an embodiment where the copper terminals have slits to make each resistance from the copper terminal to the superconductor the same.

In one embodiment, as shown in FIG. 7, the cryogenic system 700 has a superconductor lead 701 where the copper terminal shape is a multi-prong fork. The copper terminals 5 have prongs 706 that have a similar resistance and are connected to a superconductor 7, 8 at each tip 704. Here, the superconductor is an HTS tape with slits 16 between the prongs 706. As illustrated in the system 700, the superconducting current lead 701 provides for even current distribution by configuring the copper terminals 5, 6 to have slits 16 positioned therebetween. Here, the slit 16 controls current path and resistance.

(2) Copper Terminal Compressed to Configuration of Parallel Superconductors

Figure 8:
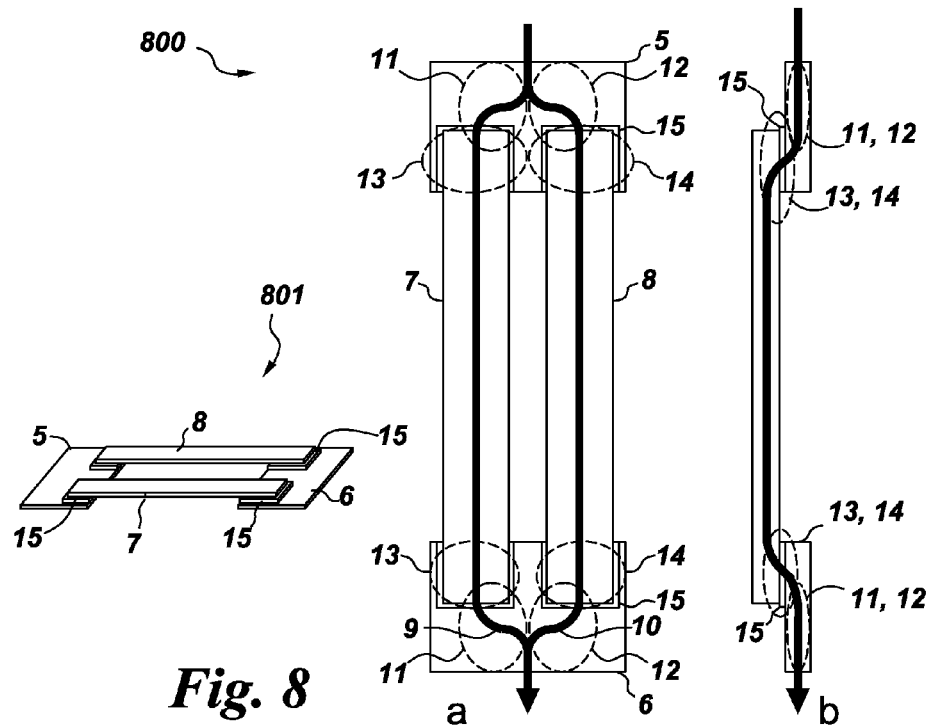
FIG. 8 provides an embodiment where an indium compressed joint is created, controlling compressive force to make contact resistance the same.

In another embodiment, as shown in FIG. 8, a system 800 utilizes a superconducting current lead 801 having a copper terminal 5 compressed to multiple superconductors, here HTS tapes 7, 8 with a similar resistive element 15 sandwiched therebetween. The resistive element utilized is Indium, but may be any resistive element as known in the art. As demonstrated, the resistive elements adjust and control resistance to provide superconducting current leads with an even current distribution.

(3) Copper Terminal Soldered to Configuration of Parallel Superconductors

Figure 9:
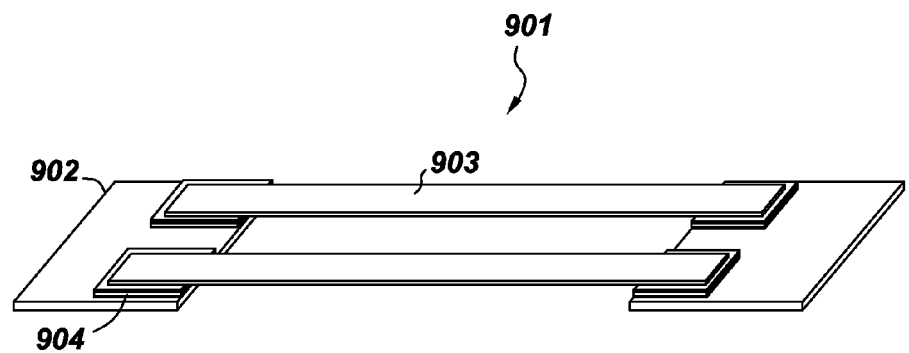
FIG. 9 illustrates one embodiment having a soldered resistive element, here a brass plate, to facilitate equivalent resistance for each superconductor.

As shown in FIG. 9, one embodiment of a superconducting lead 901 utilizes a copper terminal 902 soldered to multiple superconductors 903 with a similar or the same resistive element 904 (e.g., stainless steel (SST) or brass) sandwiched therebetween. This resistive element takes the place of resistance controlling elements 15 as shown in FIG. 8.

(4) Combination: Multi-Prong Terminal Compressed

Embodiments also integrate one or more of the above in any combination. For exemplary purposes, and not limitation, a multi-prong approach may be implemented with the copper terminal compressed to multiple superconductors, integrating the techniques using component 701 in combination with component 801.

(5) Combination: Multi-Prong Terminal with Soldering

Figure 10:
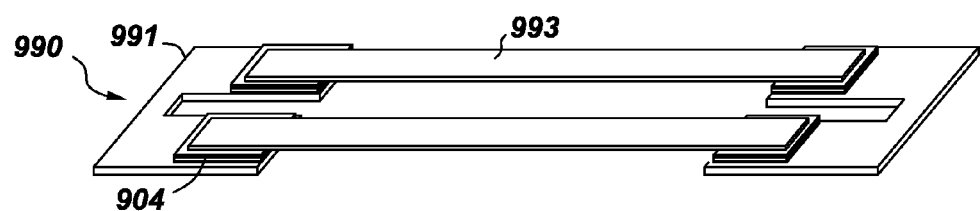
FIG. 10 is an embodiment comprising various attributes of the proposed aspects utilized in combination.

In addition, as shown in FIG. 10, an embodiment of a superconducting component 990 integrates the multi-prong approach of component 701 with a copper terminal 991 soldered to multiple superconductors 993 by using soldered resistive elements 904.

In another aspect, current distribution is measured by sensing magnetic field. The resistance is then adjusted by using any of the above devices and techniques.

FIG. 11 represents a measurement technique 111 for current sharing adjustment or validation. A field measurement 113 is taken with a Hall probe sliding over two HTS tapes, thus measuring current distribution by sensing its magnetic field. A field distribution field distribution is acquired where uneven current 115 sharing is present. The expected field distribution of even current sharing 117 results where resistance is adjusted using the methodologies described in the above embodiments.

FIG. 12 represents an embodiment of a cryogenic system 222 such that Hall probes 17 measure the magnetic field. Any magnetic field sensor, however, may be utilized. The probe moves in the direction 18 for scanning the magnetic field.

By utilizing embodiments of the present application, the number of parallel superconductors is minimized because each superconductor carries equal current until each reaches its intrinsic critical current (Ic) simultaneously. Smaller numbers of parallel superconductors provide for more cost effective systems. The smaller number of superconductor components also improves reliability in a simplified assembly process. By controlling resistance for each superconductor through one or more of the disclosed techniques, uniform current distribution is achieved. Then, the lead can be utilized at the total current with the individual conductors totaling a certain percentage (e.g., 80%, or as desired) of Ic. This provides greater stability in the operation of the lead.

Embodiments of the invention may also be developed and validated by increasing the number of parallel superconductors. This, however, adds to the cost of materials and increases the complexity of assembly. Further, increasing the current capacity of individual superconductors may also be implemented, but this too, increases cost and creates more complex assembly. Any combination of the above may be implemented as well and not depart from the invention disclosed. The attributes and techniques of embodiments of the present invention would enhance performance and improve even current distribution while providing cost effective and simplified measures for assembly. The numbers of paralleled superconductors are minimized; and the fewer elements means more reliable and more cost effective performance. Furthermore, even current distribution means more stable operation of the lead.

While the invention has been described in considerable detail with reference to a few exemplary embodiments only, it will be appreciated that it is not intended to limit the invention to these embodiments only, since various modifications, omissions, additions and substitutions may be made to the disclosed embodiments without materially departing from the scope of the invention. In addition, many modifications may be made to adapt to a particular situation or an installation, without departing from the essential scope of the invention. Thus, it must be understood that the above invention has been described by way of illustration and not limitation. Accordingly, it is intended to cover all modifications, omissions, additions, substitutions or the like, which may be comprised within the scope and the spirit of the invention as defined by the claims.

The invention claimed is:

1. A high temperature superconducting (HTS) lead for use in transmitting current from room temperature to cryogenic temperatures, comprising:
   two or more superconductors positioned in parallel, each superconductor having a first end and a second end;
   at least two electrical connectors, one connected at said first end and one connected at said second end;
   wherein each said superconductor has a current distribution controlled by resistance between the electrical connector and each of said first end and said second end of the superconductor, each said superconductor transmitting equivalent current.

2. The HTS lead of claim 1, wherein a combination of the current distribution through the superconductors has a total lead current capacity that is maximized by the equivalent current distributed through each superconductor.

3. The HTS lead of claim 1, wherein said first end is a warm end and said second end is a cold end.

4. The HTS lead of claim 1, wherein at least one electrical conductor of the two electrical connectors is a copper terminal.

5. The HTS lead of claim 4, wherein the copper terminal takes the shape of a fork with a slit between at least two prongs.

6. The HTS lead of claim 5, wherein the fork is multi-pronged.

7. The HTS lead of claim 4, wherein the copper terminal is compressed to the two or more superconductors at said first end or said second end with a resistive element sandwiched therebetween.

8. The HTS lead of claim 7, wherein the resistive element is Indium.

9. The HTS lead of claim 7, wherein the copper terminal is soldered to the two or more superconductors with a resistive element sandwiched therebetween.

10. The HTS lead of claim 9, wherein the resistive element is stainless steel, brass, other alloy materials, or combinations thereof.

11. The HTS lead of claim 1, wherein the at least two electrical conductors comprise one or more of a multi-prong copper conductor, at least one electrical conductor compressed to the two or more superconductors at said warm end or said cold end with a resistive element sandwiched therebetween, and at least one electrical conductor soldered to the two or more superconductors at said warm end or said cold end with a resistive element sandwiched therebetween, alone or in combination.

12. A method of distributing current uniformly through two or more superconductors comprising the steps of:
providing the HTS lead of claim 1; and
transmitting current from a power supply at room temperature through said superconductors to a cryogenic apparatus at cryogenic temperature, such that current distribution is uniform throughout the HTS lead.

13. The method of claim 12, further comprising a step of controlling resistance at the electrical connectors to provide equivalent current through each superconductor.

14. A method of measuring current in each of the two or more superconductors of the high temperature superconducting (HTS) lead in claim 1, the method comprising the steps of:
providing a magnetic measurement probe at the superconductors to scan a magnetic field; and
acquiring magnetic field measurements generated by the current in each of the superconductors before the current reaches respective critical currents of each of the superconductors.

15. The method of claim 14, wherein the magnetic measurement probe is a Hall probe that moves in a direction to scan the magnetic field.

16. The method of claim 14, wherein the magnetic measurement probe slides over the superconductors and measures current distribution by sensing the magnetic field generated by the current in each of the superconductors.

17. The method of claim 14, further comprising a step of acquiring a field distribution where uneven current sharing is present.

18. The method of claim 17, further comprising a step of adjusting resistance at the electrical connectors using the magnetic field measurements.

19. The method of claim 18, wherein the step of adjusting resistance, the field distribution provides even current sharing between each superconductor.

\* \* \* \* \*